United States Patent
Hattori et al.

(10) Patent No.: US 8,354,681 B2
(45) Date of Patent: Jan. 15, 2013

(54) SEMICONDUCTOR LIGHT-EMITTING ELEMENT AND MANUFACTURING METHOD THEREOF

(75) Inventors: Yasushi Hattori, Kawasaki (JP); Shinya Nunoue, Ichikawa (JP); Shinji Saito, Yokohama (JP); Genichi Hatakoshi, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 270 days.

(21) Appl. No.: 11/689,246

(22) Filed: Mar. 21, 2007

(65) Prior Publication Data

US 2008/0006838 A1    Jan. 10, 2008

(30) Foreign Application Priority Data

Jul. 4, 2006    (JP) .................................. 2006-184644

(51) Int. Cl.
*H01L 33/00*    (2010.01)
(52) U.S. Cl. .............. 257/95; 257/91; 257/99; 257/102; 257/103; 257/E33.065; 257/E33.067
(58) Field of Classification Search .................... 257/81, 257/88, 98, 99, E23.078, 79
See application file for complete search history.

(56) References Cited

U.S. PATENT DOCUMENTS

| | | | | |
|---|---|---|---|---|
| 5,554,229 A * | 9/1996 | Vogeli | ............................ | 136/259 |
| 5,998,925 A * | 12/1999 | Shimizu et al. | ............... | 313/503 |
| 6,229,160 B1 * | 5/2001 | Krames et al. | .................. | 257/94 |
| 6,429,462 B1 * | 8/2002 | Shveykin | ........................ | 257/95 |
| 6,593,602 B2 * | 7/2003 | Liang et al. | .................... | 257/189 |
| 6,777,717 B1 * | 8/2004 | Karlicek | .......................... | 257/98 |
| 2006/0043392 A1 * | 3/2006 | Kurahashi et al. | .............. | 257/91 |
| 2007/0013304 A1 | 1/2007 | Kaneko et al. | | |

FOREIGN PATENT DOCUMENTS

| | | |
|---|---|---|
| JP | 2004-56088 | 2/2004 |
| JP | 2004-319685 | 11/2004 |
| JP | 2004-343138 | 12/2004 |

OTHER PUBLICATIONS

U.S. Appl. No. 12/873,821, filed Sep. 1, 2010, Sugai, et al.

* cited by examiner

*Primary Examiner* — S. V. Clark
*Assistant Examiner* — Jesse Y Miyoshi
(74) *Attorney, Agent, or Firm* — Oblon, Spivak, McClelland, Maier & Neustadt, L.L.P.

(57) ABSTRACT

A semiconductor light-emitting element including a semiconductor substrate having a first surface and second surface faced on the opposite side of the first surface, the semiconductor substrate having a recessed portion formed in the first surface, and the recessed portion having a V-shaped cross-section, a reflecting layer formed on an inner surface of the recessed portion, a first electrode formed on the reflecting layer, a light-emitting layer formed on the second surface, and a second electrode formed on the light-emitting layer.

11 Claims, 5 Drawing Sheets

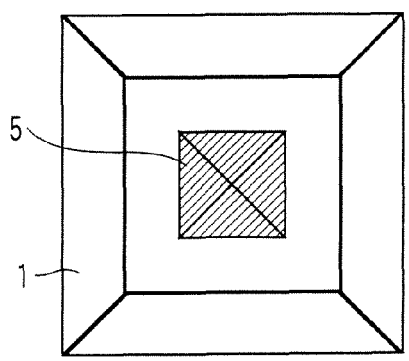
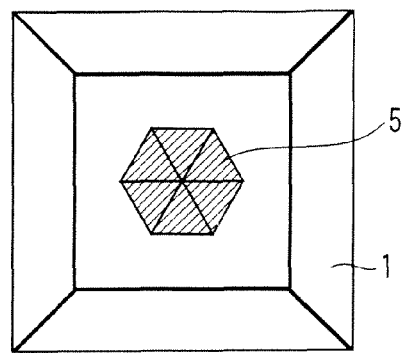
FIG. 4A          FIG. 4B
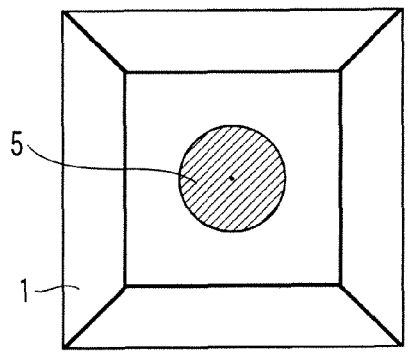
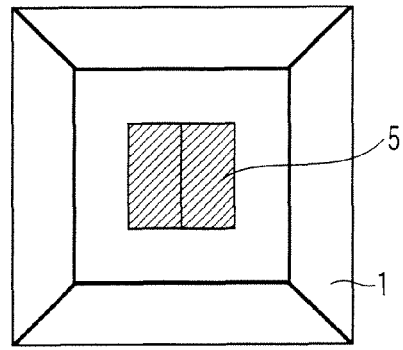
FIG. 4C          FIG. 4D
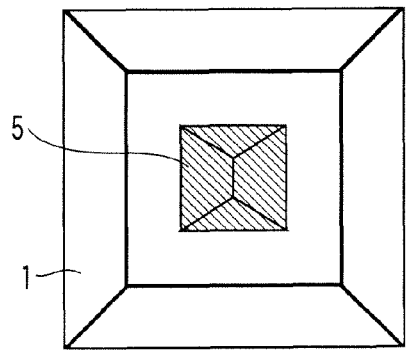
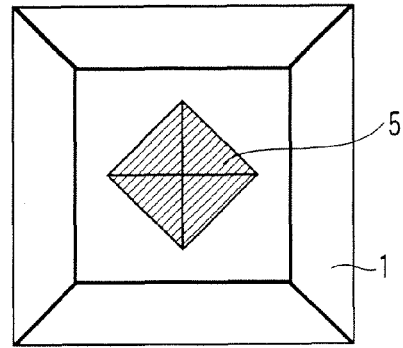
FIG. 4E          FIG. 4F
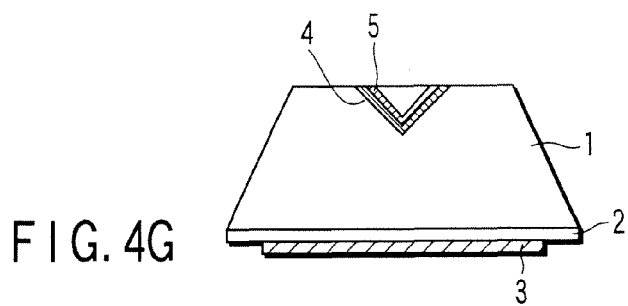
FIG. 4G

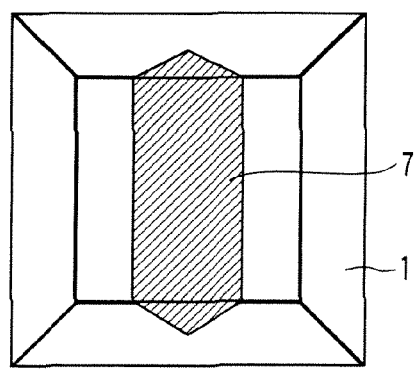
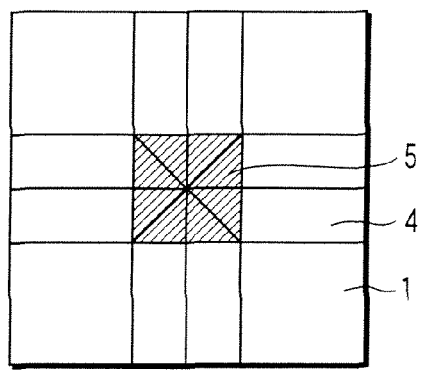
FIG. 7A              FIG. 9A
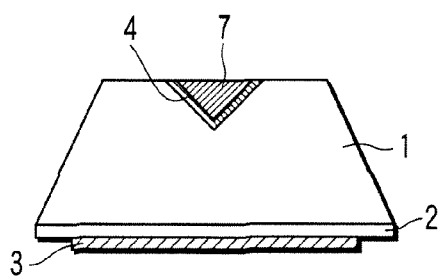
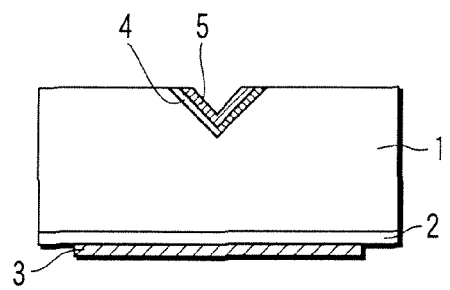
FIG. 7B              FIG. 9B
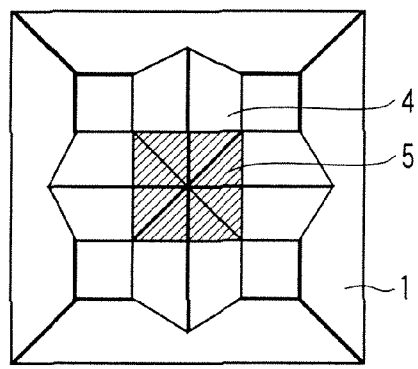
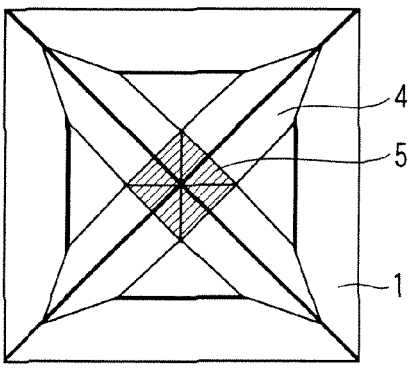
FIG. 8A              FIG. 10A
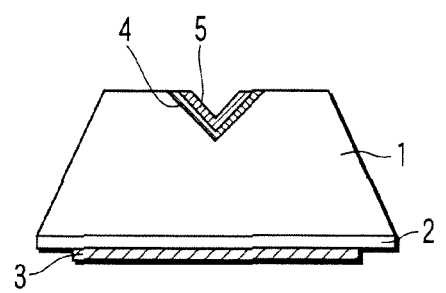
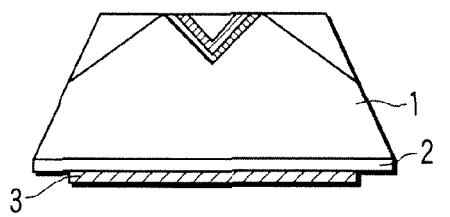
FIG. 8B              FIG. 10B

SEMICONDUCTOR LIGHT-EMITTING ELEMENT AND MANUFACTURING METHOD THEREOF

CROSS-REFERENCE TO RELATED APPLICATIONS

This application is based upon and claims the benefit of priority from prior Japanese Patent Application No. 2006-184644, filed Jul. 4, 2006, the entire contents of which are incorporated herein by reference.

BACKGROUND OF THE INVENTION

1. Field of the Invention

This invention relates to a semiconductor light-emitting element and a method of manufacturing the semiconductor light-emitting element. In particular, this invention relates to a semiconductor light-emitting element improved in light extraction efficiency, and to a method of manufacturing such a semiconductor light-emitting element.

2. Description of the Related Art

In recent years, a semiconductor light-emitting element, in particular, a light-emitting diode (LED) has been widely utilized as a backlight for a display, as a light source for vehicles, as an illumination source, etc. In these applications, the semiconductor light-emitting element has been demanded to be excellent in emission efficiency. As for one of potent means for enhancing the emission efficiency of the semiconductor light-emitting element, it is conceivable to take measures to enhance the efficiency to extract the light from the light-emitting element and hence there have been reported a large number of studies on this scheme.

For example, there has been proposed to work a substrate so as to have a V-shaped or step-like configuration on the surface thereof, thereby enabling the light being directed toward the bottom of chip to divert so as to enable the light to take up from the side face of these configurations, thus making it possible to enhance the light extraction efficiency (see, for example, JP-A 2004-56088).

There has been also proposed to make a semiconductor substrate into a flip chip so as to substantially annihilate the absorption of light by electrodes (see, for example, JP-A 2004-319685).

However, according to the configurations of the conventional semiconductor light-emitting elements disclosed in these patent publications described above, since the n-electrode and the p-electrode are both disposed on the same plane of chip and the top surface of the n-electrode is not permitted to emit the light, the conventional semiconductor light-emitting elements are accompanied with various problems that the substantial light-emitting area is caused to become smaller, that the electric current density at part of current conducting region is caused to become higher, and that the excitation efficiency is caused to deteriorate, thus giving rise to the deterioration of light-emitting efficiency. Further, the configurations disclosed in the aforementioned patent publications are also accompanied with the problem that the light is absorbed by the electrodes of the top surface of substrate, thus badly affecting the light-emitting efficiency thereof.

BRIEF SUMMARY OF THE INVENTION

An object of the present invention is to provide a semiconductor light-emitting element which is enhanced in light-emitting efficiency. Another object of the present invention is to provide a method for manufacturing such a semiconductor device.

According to a first aspect of the present invention, there is provided a semiconductor light-emitting element comprising: a semiconductor substrate having a first surface and second surface faced on the opposite side of the first surface, the semiconductor substrate having a recessed portion formed in the first surface, and the recessed portion having a V-shaped cross-section; a reflecting layer formed on an inner surface of the recessed portion; a first electrode formed on the reflecting layer; a light-emitting layer formed on the second surface; and a second electrode formed on the light-emitting layer.

According to a second aspect of the present invention, there is provided a method for manufacturing a semiconductor light-emitting element, comprising: working a semiconductor substrate having an first surface and a second surface to thereby form a recessed portion in the first surface by means of at least one of the methods selected from the group consisting of dicing, etching, laser working and drilling; forming a reflecting layer on an inner surface of the recessed portion; forming a first electrode on the reflecting layer; forming a light-emitting layer on the second surface of the semiconductor substrate; and forming a second electrode on the light-emitting layer.

BRIEF DESCRIPTION OF THE SEVERAL VIEWS OF THE DRAWING

FIGS. 4A-4F are plan views illustrating semiconductor light-emitting elements having various recessed portions;

FIG. 4G is a cross-sectional view illustrating the semiconductor light-emitting elements shown in FIGS. 4A-4F;

FIG. 7A is a plan view each illustrating a semiconductor light-emitting element according to a further embodiment of the present invention;

FIG. 7B is a cross-sectional view illustrating the semiconductor light-emitting element shown in FIG. 7A;

FIG. 8A is a plan view each illustrating a semiconductor light-emitting element according to a further embodiment of the present invention;

FIG. 8B is a cross-sectional view illustrating the semiconductor light-emitting element shown in FIG. 8A;

FIG. 9A is a plan view illustrating a semiconductor light-emitting element according to a further embodiment of the present invention;

FIG. 9B is a cross-sectional view illustrating the semiconductor light-emitting element shown in FIG. 9A;

FIG. 10A is a plan view illustrating a semiconductor light-emitting element according to a further embodiment of the present invention;

FIG. 10B is a cross-sectional view illustrating the semiconductor light-emitting element shown in FIG. 10A;

DETAILED DESCRIPTION OF THE INVENTION

Next, various embodiments of the present invention will be explained.

Figure 1:
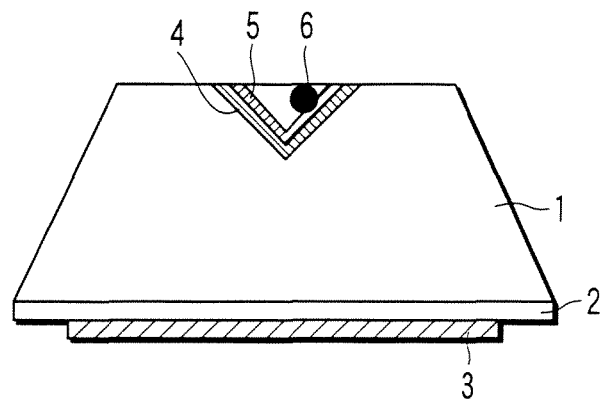
FIGS. 1, 2 and 3 are cross-sectional views showing semiconductor light-emitting elements according to various embodiments of the present invention.

FIG. 1 is a cross-sectional view showing a semiconductor light-emitting element according to one embodiment of the present invention. As shown in FIG. 1, a semiconductor substrate 1 is provided, on the underside surface thereof, with a light-emitting layer 2 and second electrode 3. Further, the semiconductor substrate 1 is provided, on the first surface thereof, with a recessed portion having a V-shaped cross-section. On the inner surface of this recessed portion, there is formed a high-reflecting layer 4, on which a first electrode 5 is formed. This first electrode 5 is connected with a wire 6.

According to the semiconductor light-emitting element of this embodiment, since the high-reflecting layer 4 is formed on the inner surface of the recessed portion having a V-shaped cross-section and formed in the first surface of the substrate 1, the light being emitted from the light-emitting layer 2 and passing via the semiconductor substrate 2 toward the first electrode 5 is caused to reflect at the high-reflecting layer 4, thereby enabling the light to take up therefrom. As a result, it is possible to enhance the light extraction efficiency and hence, to obtain a semiconductor light-emitting element having an improved light extraction efficiency.

Further, since the first electrode 5 is provided on the surface of the high-reflecting layer 4, it is possible to uniformly transmit electric current to a region of the semiconductor substrate 1 which is located between the second electrode 3 and the first electrode 5, which are respectively attached to the opposite sides of the semiconductor substrate 1, thereby making it possible to uniformly emit the light from the entire surface of the light-emitting layer 2. As a result, the high-reflecting layer 4 formed on the inner surface of the recessed portion is uniformly irradiated by the light from the light-emitting layer 2, thereby enabling the light to be uniformly extracted from the semiconductor substrate 1.

In the semiconductor light-emitting element as described above, it is possible to employ, as an appropriate material for the semiconductor substrate 1, a conductive material such as GaN, GaAs, SiC, Si, ZnO, etc.

Further, as for the light-emitting layer 2, it is possible to employ a GaN-series semiconductor material such as InGaN, GaN, AlGaN, InAlGaN, etc.; a GaAs-series semiconductor material such as InGaAs, GaAs, AlGaAs, InAlGaAs, etc.; a GaInAs-series material; and a ZnO-series material. Any of these materials can be epitaxially grown by means of vapor-phase growth method such as organometallic vapor-phase growth method, a vapor-phase growth method using a chloride and the like. As for the structure of the light-emitting layer 2, it is possible to employ a structure having a pn-junction, a laminated structure wherein an active layer is disposed between a p-type clad layer and an n-type clad layer, etc.

As for the materials for constituting the first electrode and the second electrode, it is possible to employ a metal such as gold, titanium, nickel, platinum, indium, aluminum, palladium, tin, etc; or an alloy thereof.

Figure 2:
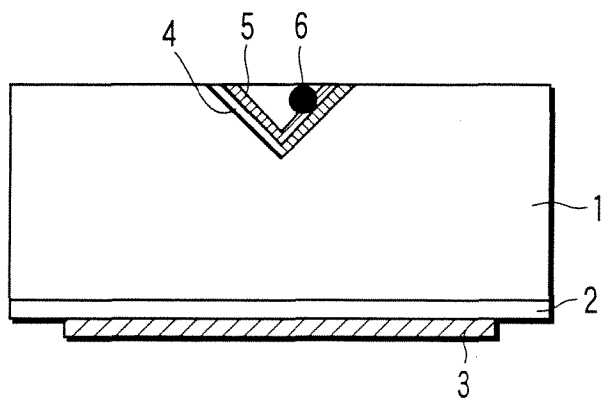

Incidentally, although it is preferable to fabricate the substrate into a configuration having a trapezoidal cross-section with inclined sidewalls as shown in FIG. 1 for the purpose of enhancing the light extraction efficiency, the substrate may be constructed so as to have vertical sidewalls as shown in FIG. 2.

As for the materials for constituting the high-reflecting layer 4, conductive materials having a high reflectance can be employed, examples of such conductive materials including silver, silver alloys, aluminum, aluminum alloys, gold, gold alloys, titanium, platinum, rhodium, etc. It is preferable, in practical viewpoints, to employ silver, silver alloys, aluminum, aluminum alloys and rhodium. Further, it is desirable, in viewpoints of the adhesion to the substrate 1 as well as in viewpoints of electric resistance, to employ, in addition to the aforementioned preferable metals, a multi-layer film comprising layers of metals such as nickel, indium, palladium, tin, zinc, copper and an alloy thereof, which are usually employed as an electrode material. Further, it is desirable, for the convenience of wire bonding, to deposit a thin gold film on the surface of the first electrode 5.

The high-reflecting layer 4 can be formed, after finishing the working for forming a recessed portion having a V-shaped cross-section in the first surface of the substrate 1, by the sputtering, vapor-depositing or plating of any of the aforementioned materials or by a method utilizing a chemical reaction, etc.

As for the method of creating the recessed portion having a V-shaped cross-section, it is possible to employ, in practical viewpoints, dicing, etching, laser working, drilling, etc. The etching may be either wet etching or dry etching. For example, the wet etching can be performed wherein a pattern of photoresist is used as a mask and a phosphate type etching liquid is employed as an etchant. On this occasion, it is possible to form a recessed portion of a desired configuration by adjusting the magnitude of etching while irradiating light to the substrate. As for the dry etching, it is preferable to employ a reactive ion beam etching (ECR-RIBE) using the mask as described above. In this case, the first surface of the substrate 1 can be worked so as to form a recessed portion having a V-shaped cross-section by irradiating beam to the substrate from two different directions angled to each other.

Incidentally, the configuration of the recessed portion may be groove-like extending in a constant direction, cone-like or pyramid-like, wherein the vertical cross-section thereof is V-shaped, thereby providing the recessed portion with a slanted surface. In order to improve the light extraction efficiency, the configuration of the recessed portion should preferably be cone-like or pyramid-like.

Figure 3:
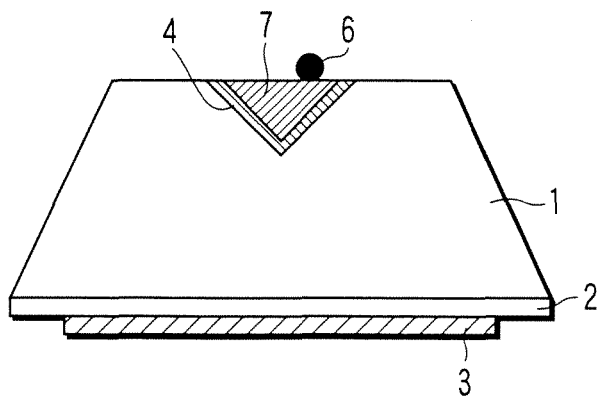
Figure 5A:
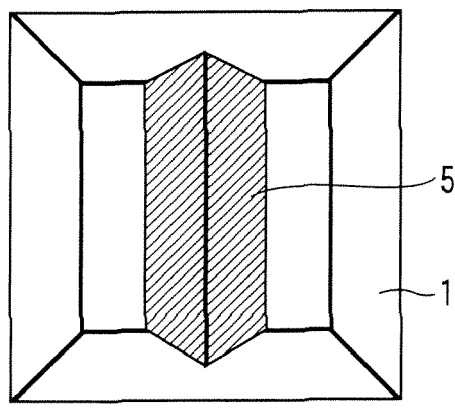
FIGS. 5A and 5B are plan views illustrating semiconductor light-emitting elements having the other recessed portions.
Figure 6A:
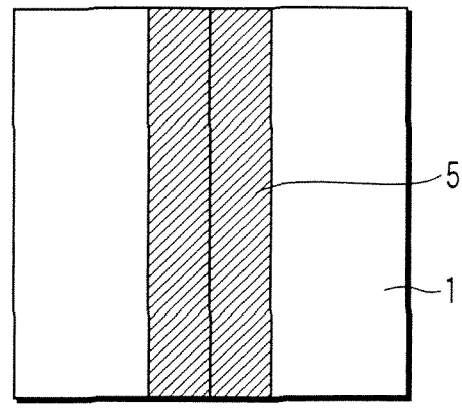
FIGS. 6A and 6B are plan views illustrating semiconductor light-emitting elements according to the other embodiments of the present invention.
Figure 5B:
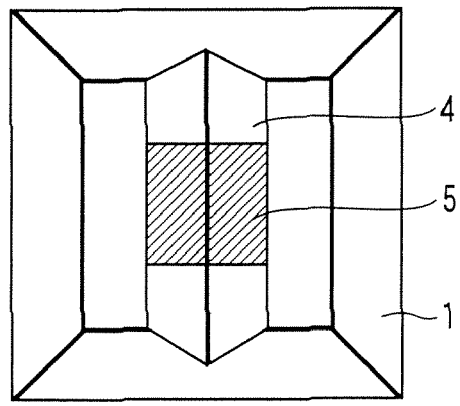
Figure 6B:
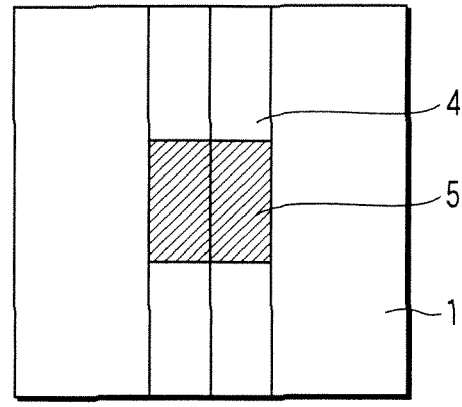
Figure 5C:
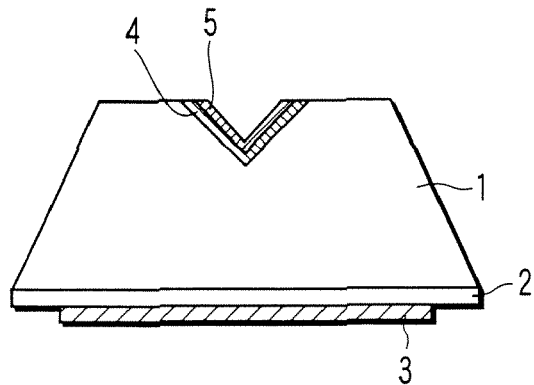
FIG. 5C is a cross-sectional view illustrating the semiconductor light-emitting elements shown in FIGS. 5A and 5B.
Figure 6C:
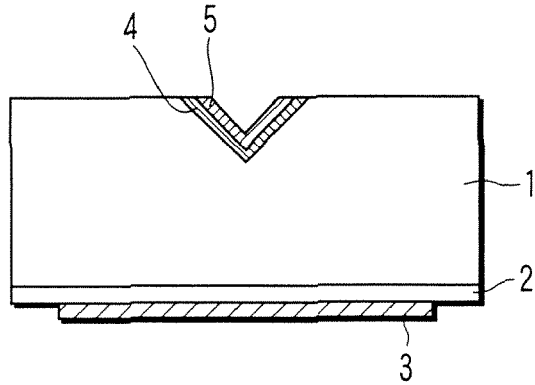
FIG. 6C is a cross-sectional view illustrating the semiconductor light-emitting elements shown in FIGS. 6A and 6B.
Figure 11A:
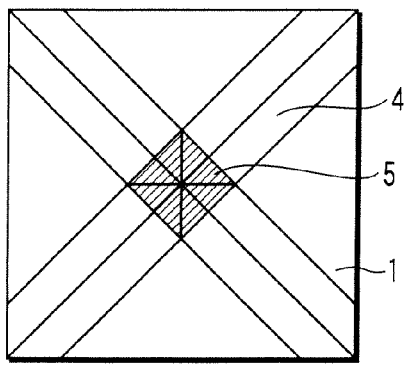
FIG. 11A is a plan view illustrating a semiconductor light-emitting element according to a further embodiment of the present invention.

As shown in FIGS. 1 and 2, although the first electrode 5 formed on the inner surface of the recessed portion is required to be connected with a wire 6, it is difficult to connect the first electrode 5 with the wire 6 at a region inside the recessed portion because of the small width of the region. Therefore, in order to facilitate the connection of the wire 6, it is preferable to fill the recessed portion having the high-reflecting layer 4 formed on the inner surface thereof with a conductive material 7 as shown in FIG. 3. As for the conductive material useful in this case, it is possible to employ, as in the case of the electrode materials, a metal such as gold, silver, titanium, nickel, platinum, aluminum, tin, palladium, etc. or alloys thereof.

Incidentally, in the embodiment shown in FIG. 3, the wire 6 is directly connected with the conductive material 7 and this conductive material 7 is employed as the first electrode. However, the first electrode may be separately formed on the surface of the conductive material 7 and the wire 6 may be connected with this first electrode.

Various modified examples of the recessed portion are shown FIG. 4A through FIG. 11B. FIGS. 4A-4G illustrate six kinds of recessed portions each having a V-shaped cross-section but differing in overall configuration thereof from each other. Specifically, FIGS. 4A-4F show respectively a plan view and FIG. 4G shows a cross-section thereof. Incidentally, the shaded portion in these plan views represents a region covered with the first electrode 5. FIG. 5A through FIG. 6C show four kinds of groove-like recessed portions each having a V-shaped cross-section and extending in one direction, wherein FIGS. 5A, 5B, 6A and 6B show respectively a plan view and FIGS. 5C and 6C show respectively a cross-sectional view thereof. Incidentally, the shaded portion in these plan views represents a region covered with the first electrode 5.

FIGS. 7A and 7B show a groove-like recessed portion having a V-shaped cross-section, extending in one direction and filled with the conductive material 7, wherein FIG. 7A shows a plan view and FIG. 7B shows a cross-sectional view thereof. Incidentally, the shaded portion in these FIGS. represents a region filled with the conductive material. FIG. 8A through FIG. 11B show various kinds of recessed portions each constituted by a couple of grooves orthogonally intersecting with each other and each having a V-shaped cross-section, wherein FIGS. 8A, 9A, 10A and 11A show respectively a plan view and FIGS. 8B, 9B, 10B and 11B show respectively a cross-sectional view thereof. Incidentally, the shaded portion in these FIGS. represents a region covered with the first electrode 5.

The groove-like recessed portion can be created by means of dicing using a blade having a tip end which is suitably angled. This groove-like recessed portion can be more easily created and is more suited for mass production as compared with the case to create a pyramid-like recessed portion. Further, the groove-like recessed portion is more advantageous in the respect that the angle and depth of the V-shape can be adjusted more easily.

Figure 12:
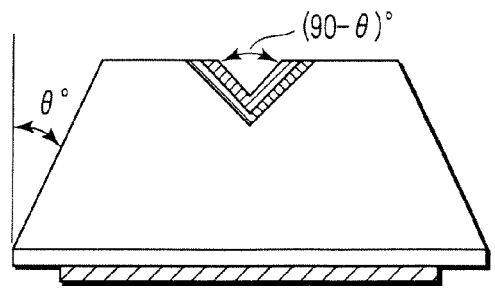
FIG. 12 is a diagram for illustrating the relationship between the angle of the side face of the substrate and the vertical angle of the recessed portion having a V-shaped cross-section.
Figure 11B:
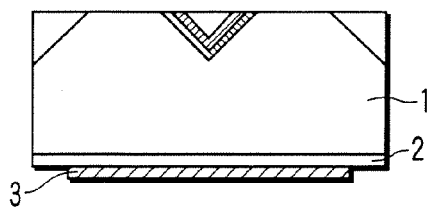
FIG. 11B is a cross-sectional view illustrating the semiconductor light-emitting element shown in FIG. 11A.

The optimal value of angle of V-shape of the recessed portion having a V-shaped cross-section varies depending on the inclination angle of the sidewall of the light-emitting element. In a case where the thickness of the substrate 1 to be worked is sufficiently large relative to the first electrode formed on the first surface thereof and to the V-shaped groove, the optimal value of the angle of V of the V-shaped groove would be $(90-\theta)°$ as the angle inclined of the sidewall of the light-emitting element from the vertical axis is defined as being $\theta°$ as shown in FIG. 12.

Figure 13:
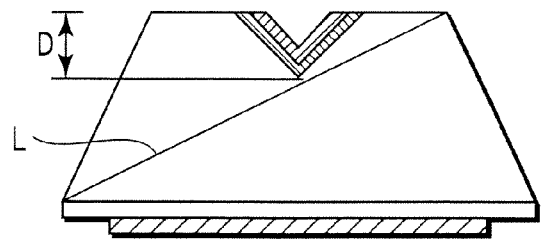
FIG. 13 is a diagram for illustrating the depth of the recessed portion having a V-shaped cross-section.

For example, when the sidewall of the light-emitting element is not inclined at all, the optimal value of the angle of V of the V-shaped groove would be 90°, whereas when the sidewall of the light-emitting element is inclined by an angle of 30°, the optimal value of the angle of V of the V-shaped groove would be 60°. However, in a case where the thickness of the substrate 1 to be worked is not sufficiently large, as the angle of V of the V-shaped groove becomes smaller, the depth of V of the V-shaped groove becomes larger, thus obstructing the light which is inherently not to be absorbed by the electrode. Because of this, the angle of V of the V-shaped groove should preferably be made larger than the optimal value to be determined as described above and the depth "D" of the V-shaped groove should preferably be shallower such that the depth "D" would not extend beyond a diagonal line "L" extended from one corner of the first surface of the chip to a diagonally opposed corner, relative to said one corner, of the underside surface of the chip as shown in FIG. 13 (practically speaking, the range of the depth of the groove will be limited, at most, to not more than about ⅓ of the thickness of the substrate).

It may become sometimes difficult, in a single groove-forming work to the substrate, to create a desired depth of the V-shaped groove as well as a desired angle of V of the V-shaped groove as described above. In that case, the substrate is at first worked so as to create a V-shaped groove having nearly desired depth and nearly desired angle of V and then, the resultant substrate is further subjected to a second working so as to obtain a desired depth of the V-shaped groove as well as a desired angle of V of the V-shaped groove.

Figure 14:
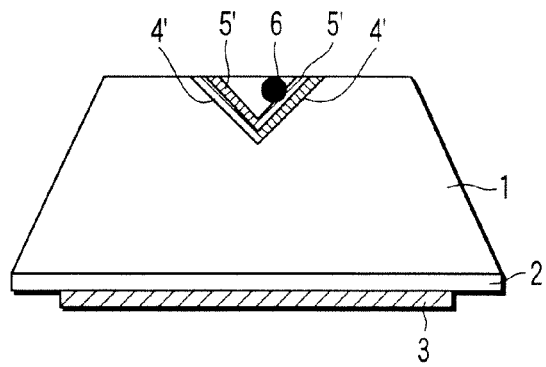
FIG. 14 is a cross-sectional view showing a semiconductor light-emitting element according to a further embodiment of the present invention.

Incidentally, it should not be construed that the present invention is limited to the aforementioned embodiments. For example, it is possible to adopt a construction wherein a distal end portion of the recessed portion having a V-shaped cross-sectional configuration is devoid of the high-reflecting layer and the first electrode in order to alleviate the concentration of electric field at this distal end portion of the recessed portion. FIG. 14 is a cross-sectional view illustrating such a construction, wherein 4' denotes the high-reflecting layer and 5' the first electrode. The construction shown in FIG. 14 can be created by removing a portion of the high-reflecting layer 4 as well as a portion of the first electrode 5 which are located at a distal end portion of the recessed portion having a V-shaped cross-sectional configuration shown in FIG. 1.

Figure 15:
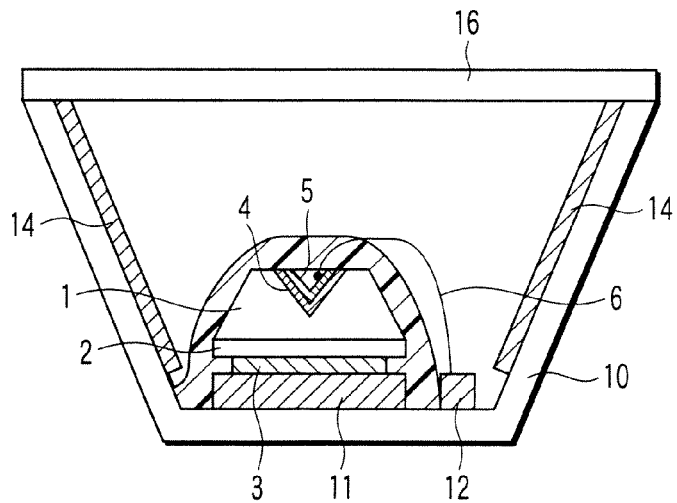
FIG. 15 is a cross-sectional view showing a light-emitting device which is capable of emitting white light according to a further embodiment of the present invention.

Further, each of the semiconductor light-emitting elements described above may be combined with a fluorescent substrate so as to fabricate a light-emitting device which is capable of emitting white light. FIG. 15 is a cross-sectional view illustrating such a construction, wherein a fluorescent substance layer is laminated on the semiconductor light-emitting element of FIG. 1 which is employed as an LED, thereby constructing a white LED. In FIG. 15, the same portions as those of FIG. 1 are identified by the same reference numbers as those of FIG. 1.

As shown in FIG. 15, a plastic cup 10 is provided, on the underside surface thereof, with a pad electrode 11 and a pad electrode 12. On the top surface of this pad electrode 11 is mounted the light-emitting diode of FIG. 1. This pad electrode 11 is electrically connected, directly or via a conductive adhesive, with the second electrode 3 of semiconductor light-emitting element. On the other hand, the pad electrode 12 is electrically connected, through a bonding wire 6, with the first electrode 5.

Further, a fluorescent substance layer 15 is coated so as to cover the semiconductor light-emitting element and the bonding wire 6. This fluorescent substance layer 15 comprises a red fluorescent substance and a green fluorescent substrate, which are dispersed in a fluorinated polymer. As for the red fluorescent substance, it is possible to employ $La_2O_2S$: Eu, Sm (the elements after colon (:) represent activating elements, the same hereinafter), etc. As for the green fluorescent substance, it is possible to employ InGaN, $BaMgAl_{27}O_{17}$: Eu, Mn, etc. It is designed such that these color fluorescent substances are excited by the light emitted from the semiconductor light-emitting element, thus causing light to be emitted from these color fluorescent substances. As a result, the emission from the semiconductor light-emitting element and the emission from each of these color fluorescent substances are superimposed with each other, thereby making it possible to obtain white light. Incidentally, it is also possible to employ a yellow fluorescent substance in place of or together with the green fluorescent substance. For example, (Sr, Ca, Ba)$_2$SiO$_4$: Eu, etc. can be employed as a yellow fluorescent substance. Further, when a yellow fluorescent substance is employed, the red fluorescent substance may be omitted as required.

On the sidewall of the cup 10 is provided a reflecting film 14. Further, the cup 10 is provided, on the top surface thereof, with a cap 16 functioning as a light-transmitting window. The emission from the semiconductor light-emitting element and the emission from each of these color fluorescent substances are partially permitted to pass through this light-transmitting window 16, thus enabling part of these emissions to be extracted outside while permitting the rest of these emissions to move toward the reflecting film 14 so as to be reflected by the reflecting film 14, thereby enabling these emissions to be extracted outside.

According to the white light-emitting device of this embodiment, it is possible to obtain almost the same effects as obtained in the above-mentioned embodiment and, at the same time, to obtain a light-emitting device which is capable of exhibiting excellent color rendering because of excellent uniformity of emission. Therefore, it is possible to provide a novel lighting system in place of the conventional fluorescent lamp.

According to the embodiments described above, since the high-reflecting layer 4 and the second electrode 5 both obstructing the transmission of light are disposed only on the inner surface of the recessed portion having a V-shaped cross-section and are not formed on the first surface region, excluding the recessed portion, of the semiconductor light-emitting element, it is now possible to extract the light that has been emitted from the light-emitting layer 2 even through the first surface region, thereby making it possible to enhance the light extraction efficiency.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor light-emitting element comprising:
   a semiconductor substrate having a first surface, a second surface which is on an opposite side of the first surface and is larger than said first surface, and an inclined sidewall, said semiconductor substrate having a groove-like recessed portion formed in the first surface, and said groove-like recessed portion having a V-shaped cross-section;
   a metal reflecting film including an upper surface and a lower surface within the recessed portion, both the upper surface and the lower surface being V-shaped, and the lower surface being formed along an inner surface of the recessed portion;
   a first electrode formed on the metal reflecting film;
   a light-emitting layer formed on the second surface; and
   a second electrode formed on the light-emitting layer,
   wherein a light component emitted from the light-emitting layer passes through the semiconductor substrate and is extracted from the first surface and the inclined sidewall, and another light component emitted from the light-emitting layer passes through the semiconductor substrate and is reflected on the metal reflecting film to be extracted from the semiconductor substrate,
   wherein the first surface is smaller than the second surface, an angle of V of the V-shaped cross-section of the recessed portion is (90-θ)° in which 0° is an inclined angle of the inclined sidewall of the semiconductor substrate with regard to an axis perpendicular to the first surface, and θ° is less than 90°, and
   wherein a depth of the recessed portion is not more than ⅓ of a thickness of the semiconductor substrate.

2. The light-emitting element according to claim 1, wherein the first electrode is formed of a conductive material having a horizontal surface and filling the recessed portion over the reflecting layer.

3. The light-emitting element according to claim 1, wherein the semiconductor substrate comprises a material selected from the group consisting of GaN, GaAs, SiC, Si and ZnO.

4. The light-emitting element according to claim 1, wherein the light-emitting layer comprises a material selected from the group consisting of a GaN-series semiconductor material, a GaAs-series semiconductor material, a GaInAs-series material and a ZnO-series material.

5. The light-emitting element according to claim 1, wherein the light-emitting layer has a pn-junction containing structure, or a laminated structure wherein an active layer is disposed between a p-type clad layer and an n-type clad layer.

6. The light-emitting element according to claim 1, wherein the first electrode and the second electrode respectively comprises a metal selected from the group consisting of gold, titanium, nickel, platinum, indium, aluminum, palladium, tin and an alloy thereof.

7. The light-emitting element according to claim 1, wherein the substrate has a trapezoidal cross-section with inclined sidewalls.

8. The light-emitting element according to claim 1, wherein the reflecting layer comprises a metal selected from the group consisting of silver, silver alloys, aluminum, aluminum alloys, gold, gold alloys, titanium, platinum and rhodium.

9. The light-emitting element according to claim 1, wherein the reflecting layer has a multi-layer structure comprising layers of metals selected from the group consisting of nickel, indium, palladium, tin, zinc, copper and an alloy thereof.

10. The light-emitting element according to claim 1, wherein the first electrode does not contain gold, and further comprising a gold thin film formed on the surface of the first electrode.

11. The light-emitting device comprising:
    a housing;
    a semiconductor light-emitting element claimed in claim 1, which is placed in the housing; and
    a fluorescent layer comprising a polymer in which a fluorescent substance is dispersed and being disposed to cover a light-emitting face of the semiconductor light-emitting element.

* * * * *